(12) United States Patent
Ji

(10) Patent No.: US 10,050,068 B2
(45) Date of Patent: Aug. 14, 2018

(54) FABRICATION METHOD OF ARRAY SUBSTRATE, ARRAY SUBSTRATE AND DISPLAY DEVICE

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventor: Xinyou Ji, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 440 days.

(21) Appl. No.: 14/387,798

(22) PCT Filed: Nov. 14, 2013

(86) PCT No.: PCT/CN2013/087125
§ 371 (c)(1),
(2) Date: Sep. 24, 2014

(87) PCT Pub. No.: WO2014/190679
PCT Pub. Date: Dec. 4, 2014

(65) Prior Publication Data
US 2016/0284742 A1    Sep. 29, 2016

(30) Foreign Application Priority Data
May 27, 2013 (CN) .......................... 2013 1 0200126

(51) Int. Cl.
*H01L 21/66* (2006.01)
*H01L 27/12* (2006.01)
*G02F 1/1362* (2006.01)

(52) U.S. Cl.
CPC ........ *H01L 27/1296* (2013.01); *G02F 1/1362* (2013.01); *H01L 22/32* (2013.01);
(Continued)

(58) Field of Classification Search
CPC ............... H01L 27/1296; G02F 1/1362; G02F 2001/136254
(Continued)

(56) References Cited

U.S. PATENT DOCUMENTS 6,873,392 B2 * 3/2005 Lim .................... G02F 1/13458
349/147
8,937,691 B2 * 1/2015 Sun ................... H01L 29/41733
349/192

(Continued)

FOREIGN PATENT DOCUMENTS

CN          103337477 A     10/2013

OTHER PUBLICATIONS

International Preliminary Report of Patentability dated Dec. 1, 2015; PCT/CN2013/087125.
(Continued)

*Primary Examiner* — Moazzam Hossain
(74) *Attorney, Agent, or Firm* — Ladas & Parry LLP

(57) ABSTRACT

A fabrication method of an array substrate, an array substrate, and a display device are provided, the array substrate comprising a pixel region, an alignment region and a pixel test region. The alignment region includes an alignment gate layer, an alignment insulating layer and an alignment pixel electrode layer sequentially formed on a substrate, the pixel test region includes a test gate layer, a test insulating layer and a test pixel electrode layer sequentially formed on the substrate, the alignment gate layer and the test gate layer are disposed on a same layer with the gate layer in the pixel region, the alignment pixel electrode layer and the test pixel
(Continued)

Alignment region electrode layer are disposed on a same layer with the pixel electrode layer in the pixel region.

13 Claims, 4 Drawing Sheets

(52) U.S. Cl.
CPC ........ *H01L 27/124* (2013.01); *H01L 27/1259* (2013.01); *G02F 2001/136254* (2013.01)

(58) Field of Classification Search
USPC .............................................. 257/48; 438/18
See application file for complete search history.

(56) References Cited

U.S. PATENT DOCUMENTS

| | | | | |
|---|---|---|---|---|
| 2008/0123005 A1* | 5/2008 | Sohn | ..................... | G02F 1/1309 349/40 |
| 2008/0135846 A1* | 6/2008 | Shin | ..................... | H01L 27/0248 257/59 |
| 2013/0038806 A1* | 2/2013 | Tae | ........................ | G09G 3/006 349/43 |

OTHER PUBLICATIONS

International Search Report Appln. No. PCT/CN2013/087125; dated Mar. 13, 2014.
First Chinese Office Action Appln. No. 201310200126.9; dated Oct. 11, 2014.

\* cited by examiner

Pixel region

Pixel test region

Alignment region

Pixel test region

Pixel test region

Pixel region

FABRICATION METHOD OF ARRAY SUBSTRATE, ARRAY SUBSTRATE AND DISPLAY DEVICE

TECHNICAL FIELD

Embodiments of the present invention relate to a fabrication method of an array substrate, an array substrate, and a display device.

BACKGROUND

A liquid crystal display panel of a thin film transistor liquid crystal display includes an array substrate and a color filter substrate. In a fabrication process of the thin film transistor liquid crystal display, the array substrate and the color filter substrate can be fabricated separately, and then the array substrate and the color filter substrate are cell-assembled and filled with liquid crystal therein, in order to form a liquid crystal panel. Before cell-assembling, firstly, an array test should be performed on the array substrate, and the test items include: TFT characteristic detection, film thickness detection and line width detection, etc.; and a test objective is to repair defective products or to perform process monitoring.

SUMMARY OF THE INVENTION

An embodiment of the present invention provides a fabrication method of an array substrate, comprising:

Forming a pattern including a gate electrode, a gate line, an alignment gate layer of an alignment region and a test gate layer of a pixel test region on a substrate;

Depositing a gate insulating layer, and removing the insulating layer on the alignment gate layer and the insulating layer on the test gate layer through a patterning process;

Forming patterns of a source-drain electrode metal layer including a source electrode, a drain electrode and a data line, and of a semiconductor layer;

Depositing a passivation layer and forming a via-hole for connecting a drain electrode and a pixel electrode through a patterning process;

Depositing a pixel electrode layer, and forming a pixel electrode, an alignment pixel electrode and a test pixel electrode through a patterning process.

Another embodiment of the present invention provides a fabrication method of an array substrate, comprising:

Forming a pattern including a gate electrode, a gate line, an alignment gate layer of an alignment region and a test gate layer of a pixel test region on a substrate;

Depositing a gate insulating layer;

Forming patterns of a source-drain electrode metal layer including a source electrode, a drain electrode and a data line, and of a semiconductor layer;

Depositing a passivation layer, and forming a via-hole for connecting a drain electrode and a pixel electrode through a patterning process, and simultaneously removing the passivation layer in the alignment region and the passivation layer in the pixel test region;

Depositing a pixel electrode layer, and forming a pixel electrode, an alignment pixel electrode and a test pixel electrode through a patterning process.

In one example, thicknesses of the gate electrode, the gate line, the alignment gate layer and the test gate layer are substantially same as a thickness of the gate insulating layer.

In one example, thicknesses of the gate electrode, the gate line, the alignment gate layer and the test gate layer are substantially same as a thickness of the passivation layer.

Still another embodiment of the present invention provides an array substrate, comprising a pixel region, an alignment region and a pixel test region, wherein, the alignment region includes an alignment gate layer, an alignment insulating layer and an alignment pixel electrode layer sequentially formed on a substrate, the pixel test region includes a test gate layer, a test insulating layer and a test pixel electrode layer sequentially formed on the substrate, the alignment gate layer and the test gate layer are disposed on a same layer with a gate layer in the pixel region, the alignment pixel electrode layer and the test pixel electrode layer are disposed on a same layer with a pixel electrode layer in the pixel region, the alignment insulating layer and the test insulating layer are disposed on a same layer with and have a same thickness with a gate insulating layer in the pixel region or a passivation layer in the pixel region, with the same thickness.

In one example, thicknesses of the alignment gate layer and the test gate layer are same as a thickness of the gate layer in the pixel region.

In one example, thicknesses of the alignment pixel electrode layer and the test pixel electrode layer are same as a thickness of the pixel electrode in the pixel region.

In one example, thicknesses of the gate layer in the pixel region, the alignment gate layer and the test gate layer are substantially same as a thickness of the gate insulating layer.

In one example, thicknesses of the gate layer in the pixel region, the alignment gate layer and the test gate layer are substantially same as a thickness of the passivation layer.

In one example, the pixel test region is located at an edge of the pixel region.

Yet another embodiment of the present invention provides a display device, comprising an array substrate according to any one embodiment of the present invention.

In the fabrication method of an array substrate, the array substrate and the display device provided by the embodiments of the present invention, since the alignment gate layer and the test gate layer are formed on the same layer with the gate layer, and since typically a film layer thickness of the gate layer is similar to that of the gate insulating layer, and a film layer thickness of the gate layer is similar to that of the passivation layer during fabrication of the array substrate, thicknesses of the alignment gate layer, the test gate layer and the gate insulating layer are similar to that of the passivation layer. Therefore, a film layer thickness of the pixel region is similar to that of the pixel test region, their exposure intensities are similar, and the line widths of the pixel electrodes finally measured are approximate with each other, which can reflect the line width of the pixel electrode more truly.

BRIEF DESCRIPTION OF THE DRAWINGS

In order to clearly illustrate the technical solution of the embodiments of the present invention, the drawings of the embodiments will be briefly described in the following; it is obvious that the described drawings are only related to some embodiments of the invention and thus are not limitative of the present invention.

DESCRIPTION OF THE EMBODIMENTS

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

Hereinafter, a fabrication method of an array substrate, an array substrate and a display device provided by the embodiments of the present invention are described in conjunction with FIG. 4-FIG. 8.

Figure 1:
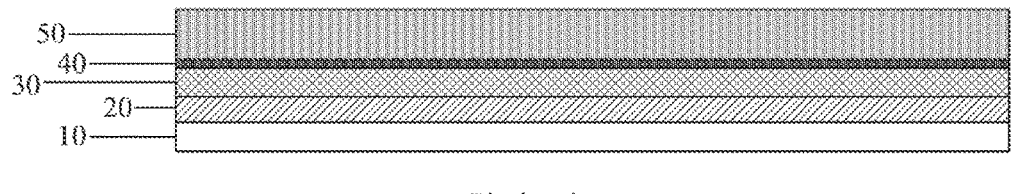
FIG. 1 is a cross-sectional schematic diagram of a pixel region of an array substrate in the prior art.
Figure 2:
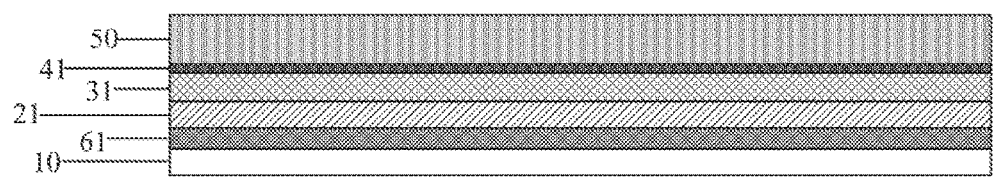
FIG. 2 is a cross-sectional schematic diagram of a pixel test region of an array substrate in the prior art.
Figure 3:
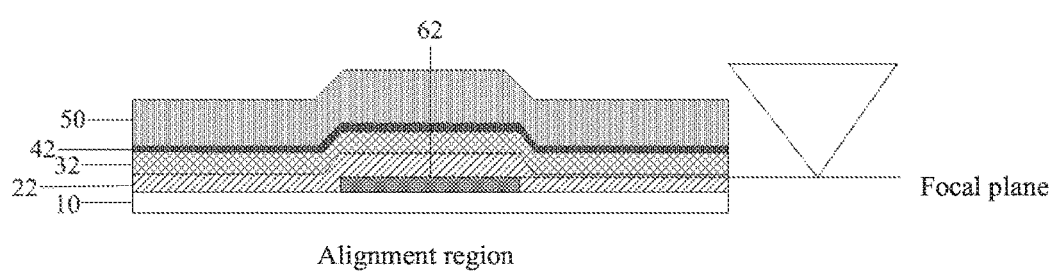
FIG. 3 is a cross-sectional schematic diagram of an alignment region of an array substrate in the prior art.
Figure 4:
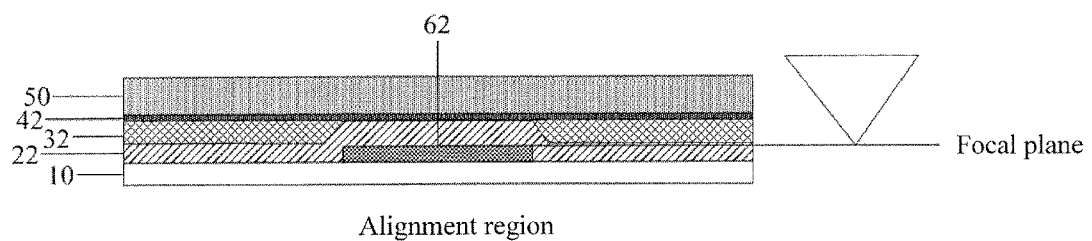
FIG. 4 is a cross-sectional schematic diagram of an alignment region of an array substrate of the present invention.
Figure 5:
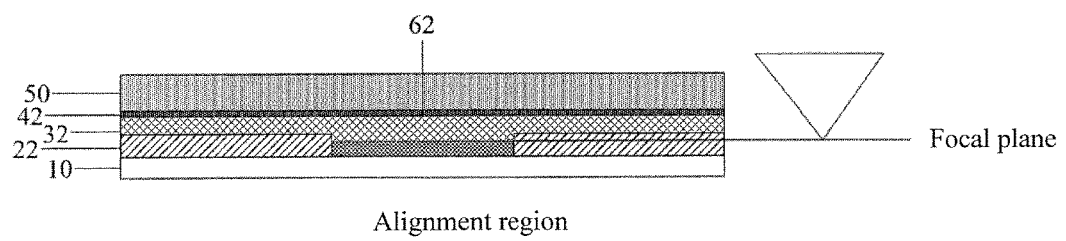
FIG. 5 is another cross-sectional schematic diagram of an alignment region of an array substrate of the present invention.
Figure 6:
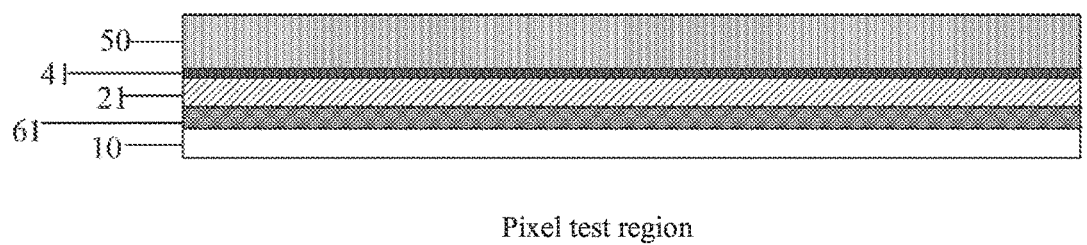
FIG. 6 is a cross-sectional schematic diagram of a pixel test region of an array substrate of the present invention.
Figure 7:
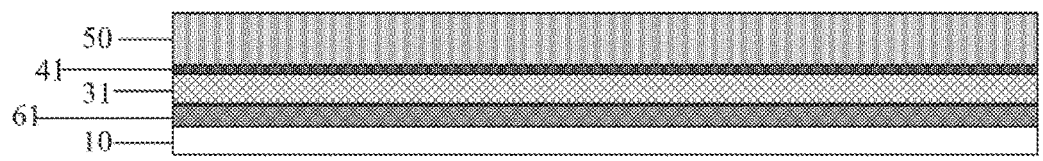
FIG. 7 is another cross-sectional schematic diagram of a pixel test region of an array substrate of the present invention.
Figure 8:
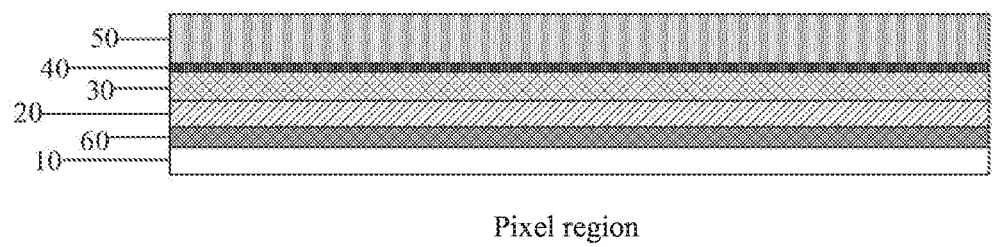
FIG. 8 is a cross-sectional schematic diagram of a pixel region of an array substrate of the present invention.
Figure 9:
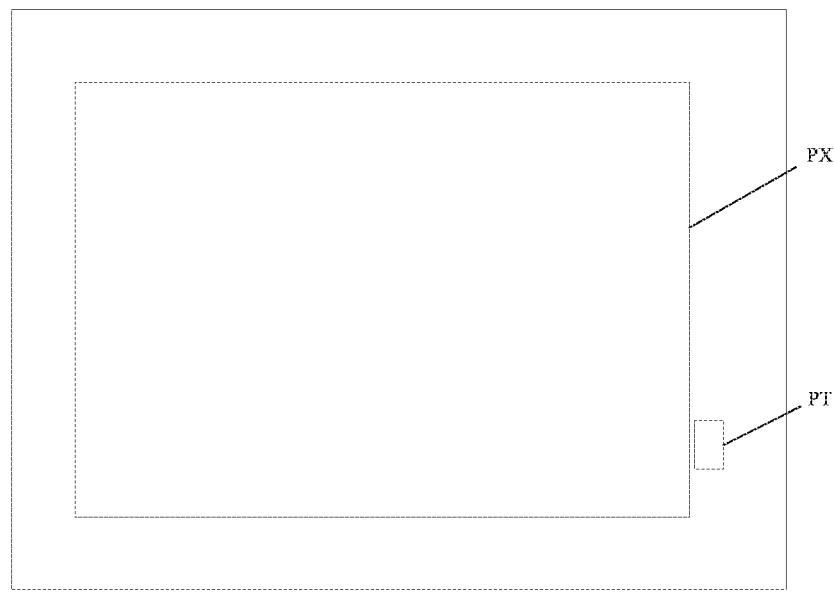
FIG. 9 is a plane view schematic diagram of an array substrate of the present invention.

During a line width test, since a pixel electrode is a transparent conductive thin film, the line width of the pixel electrode cannot be measured directly when a pattern of the pixel electrode is being formed by performing a pixel electrode conductive layer etching process. In order to test the width of the pixel electrode, the line width of the pixel electrode is measured indirectly by testing a distance between adjacent pixel electrodes in a pixel test region of the array substrate. For example, as illustrated in FIG. 6 to FIG. 8, a test gate layer 61, a test insulating layer and a test pixel electrode layer 41 are sequentially formed in a pixel test region on an array substrate 10, wherein the test gate layer 61 is disposed on a same layer with a gate layer 60 in a pixel region, the test insulating layer includes an insulating layer 21 disposed on a same layer with a gate insulating layer 20 in the pixel region and an insulating layer 31 disposed on a same layer with a passivation layer 30 in the pixel region, and the test pixel electrode layer 41 is disposed on a same layer with the pixel electrode layer 40 in the pixel region. Thus, a test pixel electrode is formed at the same time when the pixel electrode is formed. Since the test gate layer 61 is disposed below the test pixel electrode 41, which plays a role of light blocking, a boundary of the test pixel electrode 41 can be clearly seen after the test pixel electrode layer is etched. In this way, the line width of the pixel electrode can be indirectly measured.

A process of forming the pixel electrode and the test pixel electrode is: applying photoresist 50 after a transparent conductive thin film is deposited, then after a series of exposing, developing and etching, finally forming patterns of the pixel electrode and the test pixel electrode. Before exposure, exposure machine should be aligned firstly, with an alignment benchmark being an alignment gate layer in an alignment region. The alignment region is a structure as specifically illustrated in FIG. 4 to FIG. 8, including an alignment gate layer 62, an alignment insulating layer and an alignment pixel electrode layer 42 sequentially formed on the substrate 10, the alignment gate layer 62 being disposed on a same layer with the gate layer 60 in the pixel region, the alignment insulating layer including an insulating layer 22 disposed on a same layer with a gate insulating layer 20 in the pixel region and an insulating layer 33 disposed on a same layer with a passivation layer 30, and the alignment pixel electrode layer 42 being disposed on a same layer with the pixel electrode layer 40. Alignment is performed with the alignment gate layer 62 as the alignment benchmark. However, since the alignment gate layer 62 is added to the alignment region as compared with the pixel region, and the test gate layer 61 is added to the pixel test region as compared with the pixel region, film thicknesses of the alignment region and the pixel test region are greater than a film thickness of the pixel region, which renders an exposure intensity in the pixel test region different from that in the pixel region. The thicker the film, the weaker the exposure intensity. Therefore, the line width of the test pixel electrode is less than the actual line width of the pixel electrode, which cannot truly reflect the line width of the pixel electrode.

A fabrication method of an array substrate according to an embodiment of the present invention, comprises steps of:

S11: Forming a pattern including a gate electrode, a gate line, an alignment gate layer 62 of an alignment region and a test gate layer 61 of a pixel test region on a substrate 10.

For example, firstly, a gate electrode metal thin film is formed on the entire substrate, and the substrate may be either a transparent glass substrate or a quartz substrate. For example, a layer of gate electrode metal thin film may be deposited on the substrate by a sputtering or thermal evaporation deposition method. The gate metal thin film may be metals such as Cr, W, Ti, Ta, Mo, Al, Cu and alloys thereof. Of course, the gate electrode metal thin film may further consist of multiple layers of metal films, which will not be limited by the present invention herein.

Then, a first photoresist is coated on the gate electrode metal thin film. For example, photoresist with a thickness of about 1 to 4 microns may be coated. Next, a first photoresist pattern is formed by an exposure process and development with a first mask. Then the gate electrode metal thin film exposed by the first photoresist pattern is etched, for example, an acid etching is performed by using a chemical method; and the acid used therein may be sulfuric acid, nitric acid, acetic acid and mixed acid with a certain concentration. Thereby, the pattern including the gate electrode, the gate line, the alignment gate layer of the alignment region and the test gate layer of the pixel test region is formed. By changing a pattern of the mask, this step forms patterns of the alignment gate layer and the test gate layer while the gate line and the gate electrode are formed. The test gate layer is disposed on the lowest layer of the pixel test region, playing a role of light blocking, to facilitate measuring the line width of the pixel electrode.

S12: Depositing a gate insulating layer 20 on the substrate where the above-described step is completed, and removing the gate insulating layer on the alignment gate layer 62 and the gate insulating layer on the test gate layer 61 through a patterning process.

For example, firstly, a gate insulating layer thin film may be deposited on the entire substrate by a chemical vapor deposition method. It should be noted that material used for the gate insulating layer thin film is typically silicon nitride, and may also be silicon oxide and silicon oxynitride. Then a second photoresist is coated on the gate insulating layer, and a second photoresist pattern is formed by using a second mask by an exposure process and development. Then, the gate insulating layer thin film exposed by the second photoresist pattern is etched, so as to form the pattern after the gate insulating layer in the alignment region and an insulating layer in the pixel test region are removed.

It should be noted that, for an Advanced Super Dimension Switch (ADS) product, it is typically necessary to remove part of the gate insulating layer by using a gate insulating mask, in order to save space of an electric-shock safeguard region and a drive circuit region. Therefore, the gate insulating layer in the alignment region and the gate insulating layer in the pixel test region are removed while part of the gate insulating layer of the electric-shock safeguard region and the drive circuit region is removed, by changing a pattern design of the mask in this step, which may not require to add a separate process of removing the gate insulating layer in the alignment region and the gate insulating layer in the pixel test region.

S13: Forming patterns of a source-drain electrode metal layer including a source electrode, a drain electrode and a data line, and of a semiconductor layer on the substrate where the above-described steps are completed.

For example, an amorphous silicon thin film, an n-type silicon thin film and a source-drain electrode metal thin film can be continuously deposited on the substrate by using a chemical vapor deposition method. Of course, a method for depositing the multiple films on the substrate may be other method, which will not be limited by the present invention herein.

Then a third photoresist is coated on the substrate where the above-described multiple films are deposited, and then a third photoresist pattern is formed on the glass substrate by an exposure process and development with a third mask. Finally patterns of the source-drain electrode metal layer and the semiconductor layer are formed by etching. Of course, this step can further form the patterns of the source-drain electrode metal layer and the semiconductor layer by using two times of the exposure mask, which will not be limited by the present invention.

S14: Depositing a passivation layer 30 on the substrate where the above-described steps are completed, and forming a via-hole for connecting a drain electrode and a pixel electrode through a patterning process.

For example, the passivation layer is deposited on the entire substrate where the patterns of the source-drain electrode metal layer including the source electrode, the drain electrode and the data line, and of the semiconductor layer are formed, then a fourth photoresist is coated on the substrate after the passivation layer is deposited, and then a fourth photoresist pattern is formed on the glass substrate by an exposure process and development with a fourth mask. Finally, a passivation layer pattern of a via-hole for connecting the drain electrode and the pixel electrode is formed by etching.

S15: Depositing a pixel electrode layer 40 on the substrate after the above-described steps are completed, and forming patterns of the pixel electrode, the alignment pixel electrode and test pixel electrode through a patterning process.

In this step, firstly, a layer of transparent conductive thin film is deposited on the entire substrate after the via-hole is formed. The typically used material of the transparent conductive thin film may be ITO or IZO, which will not be limited by the present invention herein.

Then, a fifth photoresist 50 is coated on the transparent conductive thin film. Next, a fifth photoresist pattern is formed by an exposure process and development with a fifth mask. Finally, the patterns of the pixel electrode, the alignment pixel electrode and the test pixel electrode are formed by etching the transparent conductive thin film of pixel electrode, the alignment pixel electrode and the test pixel electrode exposed by the fifth photoresist pattern.

In summary, in the array substrate obtained by the fabrication method of the array substrate provided by the above-described embodiments, since the alignment gate layer and the test gate layer are formed on the same layer with the gate layer, and since typically a film layer thickness of the gate layer is typically similar to that of the gate insulating layer during fabrication of the array substrate, the thicknesses of the alignment gate layer and the test gate layer are similar to that of the gate insulating layer, and the film layer thickness of the pixel region is similar to that of the pixel test region; thereby, their exposure intensities are similar, and the line widths of the pixel electrodes finally measured are approximate with each other, which can reflect the line width of the pixel electrode more truly.

Another fabrication method of an array substrate provided by an embodiment of the present invention, comprises steps of:

S21: Forming a pattern including a gate electrode, a gate line, an alignment gate layer 62 of an alignment region and a test gate layer 61 of a pixel test region on a substrate.

This step is the same as step S11 in the above-described embodiment, which will not be repeated in this embodiment.

S22: Depositing a gate insulating layer 20 on the substrate where the above-described step is completed.

This step is different from step S12 in that, after the gate insulating layer is deposited, the process of removing the insulating layer of the alignment region and the insulating layer in the pixel test region is not performed.

S23: Forming patterns of a source-drain metal layer including a source electrode, a drain electrode and a data line, and of a semiconductor layer on the substrate after the above-described steps are completed.

This step is the same as step S13 in the above-described embodiment, which will not be repeated in this embodiment.

S24: Depositing a passivation layer on the substrate after the above-described steps are completed, and a forming a via-hole for connecting a drain electrode and a pixel electrode through a patterning process, and meanwhile removing the passivation layer 32 in the alignment region and the passivation layer 31 in the pixel test region.

This step is different from step S14 in that, when a via-hole is formed, the passivation layer in the alignment region and the passivation layer in the pixel test region are removed at the same time by changing a pattern design of a mask.

S25: Depositing a pixel electrode layer on the substrate after the above-described steps are completed, and forming the pixel electrode, an alignment electrode and a test pixel electrode through a patterning process.

This step is the same as step S15 in the above-described embodiment, which will not be repeated in this embodiment.

In summary, in the array substrate obtained by the fabrication method of an array substrate provided by the above-described embodiments, since the alignment gate layer and the test gate layer are formed on the same layer with the gate layer, and since typically a film layer thickness of the gate layer is similar to that of the gate insulating layer, and the film layer thickness of the gate layer is similar to that of the passivation layer during fabrication of the array substrate, the thicknesses of the alignment gate layer, and the test gate layer and the gate insulating layer are similar to that of the passivation layer. Therefore, a film layer thickness of the pixel region is similar to that of the pixel test region, their exposure intensities are similar, and the line widths of the pixel electrodes finally measured are approximate with each other, which can reflect the line width of the pixel electrode more truly.

An embodiment of the present invention further provides an array substrate, the array substrate comprises a pixel region, an alignment region and a pixel test region, wherein, the alignment region includes an alignment gate layer, an alignment insulating layer and an alignment pixel electrode layer sequentially formed on a substrate, the pixel test region includes a test gate layer, a test insulating layer and a test pixel electrode layer sequentially formed on the substrate, the alignment gate layer and the test gate layer are disposed on a same layer with the gate layer in the pixel region, the alignment pixel electrode layer and the test pixel electrode layer are disposed on a same layer with the pixel electrode layer in the pixel region, the alignment insulating layer and the test insulating layer are disposed on a same layer with and have the same thickness with the gate insulating layer in the pixel region or the passivation layer in the pixel region.

Referring to the above-described fabrication method according to the embodiments of the present invention, since the alignment gate layer and the test gate layer are formed simultaneously by the same process step with the gate layer in the pixel region, the thicknesses of the alignment gate layer and the test gate layer are the same as that of the gate layer in the pixel region; since the alignment pixel electrode layer and the test pixel electrode layer are formed simultaneously by the same process step with the pixel electrode layer in the pixel region, the thicknesses of the alignment pixel layer and the test pixel electrode layer are the same as that of the pixel electrode layer in the pixel region.

In the array substrate provided by the embodiments of the present invention, since the alignment gate layer and the test gate layer are formed on the same layer with the gate layer, and since typically a film layer thickness of the gate layer is similar to that of the gate insulating layer, and a film layer thickness of the gate layer is similar to that of the passivation layer during fabrication of the array substrate, the thicknesses of the alignment gate layer, the test gate layer and the gate insulating layer are similar to that of the passivation layer. Therefore, a film layer thickness of the pixel region is similar to that of the pixel test region, their exposure intensities are similar, and the line widths of the pixel electrodes finally measured are approximate with each other, which can reflect the line width of the pixel electrode more truly.

In one example, the thicknesses of the gate layer (e.g., the gate electrode and the gate line) in the pixel region, the alignment gate layer and the test gate layer are substantially the same as the thickness of the gate insulating layer; the thicknesses of the gate layer (e.g., the gate electrode and the gate line) in the pixel region, the alignment gate layer and the test gate layer are substantially the same as a thickness of the passivation layer.

For example, in the array substrate 100, the pixel test region PT is located at an edge of the pixel region PX.

Accordingly, an embodiment of the present invention further provides a display device, the display device comprising an array substrate according to any of the above-described embodiments, which will not be repeated herein. For other parts of the display device, the prior art can be referred to.

The display device comprises any product or component having a display function such as a liquid crystal panel, e-paper, an Organic Light-Emitting Diode (OLED) panel, a mobile phone, a tablet computer, a television, a monitor, a notebook computer, a digital picture frame, a navigator, which will not be defined in the present invention.

The foregoing embodiments merely are exemplary embodiments of the invention, and not intended to define the scope of the invention, and the scope of the invention is determined by the appended claims.

What is claimed is:

1. An array substrate, comprising a pixel region, an alignment region and a pixel test region, wherein, the alignment region includes an alignment gate layer, an alignment insulating layer and an alignment pixel electrode layer sequentially formed on a substrate, the pixel test region includes a test gate layer, a test insulating layer and a test pixel electrode layer sequentially formed on the substrate, the pixel region includes a gate layer, a gate insulating layer, a passivation layer and a pixel electrode layer sequentially formed on the substrate, the alignment gate layer and the test gate layer are disposed on a same layer with the gate layer in the pixel region, the alignment pixel electrode layer and the test pixel electrode layer are disposed on a same layer with the pixel electrode layer in the pixel region, the alignment insulating layer, the test insulating layer and one of the gate insulating layer and the passivation layer are disposed on a same layer and with a same thickness.

2. The array substrate according to claim 1, wherein, thicknesses of the alignment gate layer and the test gate layer are same as a thickness of the gate layer in the pixel region.

3. The array substrate according to claim 1, wherein, thicknesses of the alignment pixel electrode layer and the test pixel electrode layer are same as a thickness of the pixel electrode layer in the pixel region.

4. The array substrate according to claim 1, wherein, thicknesses of the gate layer in the pixel region, the alignment gate layer and the test gate layer are substantially same as a thickness of the gate insulating layer.

5. The array substrate according to claim 1, wherein, thicknesses of the gate layer in the pixel region, the alignment gate layer and the test gate layer are substantially same as a thickness of the passivation layer.

6. The array substrate according to claim 1, wherein, the pixel test region is located at an edge of the pixel region.

7. A display device, comprising the array substrate according to claim 1.

8. The array substrate according to claim 2, wherein, thicknesses of the alignment pixel electrode layer and the test pixel electrode layer are same as a thickness of the pixel electrode layer in the pixel region.

9. The array substrate according to claim 2, wherein, thicknesses of the gate layer in the pixel region, the alignment gate layer and the test gate layer are substantially same as a thickness of the gate insulating layer.

10. The array substrate according to claim 3, wherein, thicknesses of the gate layer in the pixel region, the alignment gate layer and the test gate layer are substantially same as a thickness of the gate insulating layer.

11. The array substrate according to claim 2, wherein, thicknesses of the gate layer in the pixel region, the alignment gate layer and the test gate layer are substantially same as a thickness of the passivation layer.

12. The array substrate according to claim 3, wherein, thicknesses of the gate layer in the pixel region, the alignment gate layer and the test gate layer are substantially same as a thickness of the passivation layer.

13. The array substrate according to claim 2, wherein, the pixel test region is located at an edge of the pixel region.

* * * * *